US006487132B2

United States Patent
Bae et al.

(10) Patent No.: US 6,487,132 B2
(45) Date of Patent: Nov. 26, 2002

(54) INTEGRATED CIRCUIT MEMORY DEVICES HAVING MULTIPLE INPUT/OUTPUT BUSES AND PRECHARGE CIRCUITRY FOR PRECHARGING THE INPUT/OUTPUT BUSES BETWEEN WRITE OPERATIONS

(75) Inventors: Yong-Cheol Bae, Seoul (KR); Jung-Hwa Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/773,780

(22) Filed: Jan. 31, 2001

(65) Prior Publication Data

US 2001/0015929 A1 Aug. 23, 2001

(30) Foreign Application Priority Data

Jan. 31, 2000 (KR) .......................................... 2000-4643

(51) Int. Cl.[7] ................................................ G11C 7/00
(52) U.S. Cl. .................. 365/203; 365/233; 365/230.06
(58) Field of Search ........................... 365/203, 189.11, 365/233, 235, 230.06; 326/86

(56) References Cited

U.S. PATENT DOCUMENTS

| | | | | |
|---|---|---|---|---|
| 5,502,684 A | * | 3/1996 | Koshikawa | ............ 365/230.06 |
| 5,742,185 A | * | 4/1998 | Lee | ............................. 365/203 |
| 5,844,848 A | | 12/1998 | Cho | ............................. 365/190 |
| 6,185,256 B1 | * | 2/2001 | Saito et al. | ................... 375/357 |

* cited by examiner

Primary Examiner—Amir Zarabian
Assistant Examiner—VanThu Nguyen
(74) Attorney, Agent, or Firm—Myers Bigel Sibley & Sajovec

(57) ABSTRACT

Integrated circuit memory devices include precharge controller circuit, which generates a precharge control signal in response to completion of a write operation on a first input/output bus. A precharge circuit drives the first and a input/output buses to a predetermined voltage level in response to the precharge control signal. Multiple switches may be used to couple the first and second input/output buses to the memory cell array and these switches may also be coupled to a column select line. The switches may be responsive to a column select signal carried on the column select line such that one or more memory cells are coupled to the first input/output bus and one or more memory cells are coupled to the second input/output bus simultaneously. Because both of the input/output buses are coupled to the memory cell array in response to the column select signal, the memory cell array may be susceptible to bit line disturbance in which charges remaining on one input/output bus from a previous write operation corrupt memory cells during a write operation on a second input/output bus. By driving the first and second input/output buses to a predetermined voltage level after completing a write operation on one of the two input/output buses, bit line disturbance may be prevented.

22 Claims, 5 Drawing Sheets

US 6,487,132 B2

INTEGRATED CIRCUIT MEMORY DEVICES HAVING MULTIPLE INPUT/OUTPUT BUSES AND PRECHARGE CIRCUITRY FOR PRECHARGING THE INPUT/OUTPUT BUSES BETWEEN WRITE OPERATIONS

RELATED APPLICATION

This application claims the benefit of Korean Patent Application No. 2000-04643, filed Jan. 31, 2000, the disclosure of which is hereby incorporated herein by reference.

FIELD OF THE INVENTION

The present invention relates generally to integrated circuit devices and, more particularly, to integrated circuit memory devices having multiple input/output buses.

BACKGROUND OF THE INVENTION

Integrated circuit memory devices, particularly dynamic access memories (DRAMs), are widely used in electronic systems for storing large volumes of digital information. As electronic systems operate at more rapid processing speeds, however, the access times for reading data from or writing data to a DRAM may become an important parameter when designing a high-performance electronic system.

Various techniques for improving the access time of a DRAM have been developed. According to one method known as "nibble mode," access time delay may be reduced by constructing a DRAM so that four sequential bits may be accessed rapidly and sequentially. According to another method known as "burst mode," data bits belonging to a row (e.g., a word line) may be sequentially accessed after a first data bit is accessed. This method may also be referred to as "pull page mode." After inputting an initial address in burst mode operation, sequential addresses are internally and sequentially generated without inputting new address information to the DRAM. According to the aforementioned methods, the access time of a DRAM may be improved by reducing and/or eliminating the delay time that is needed to fetch an address associated with the respective access of sequential bits.

FIG. 1 is a diagram that illustrates a relationship between a memory cell array and pairs of input/output lines in a conventional dynamic random access memory device. A memory cell array 1 includes a plurality of word lines WLi (i=0–m), a plurality of bit line pairs BLj and BLjB (=0–n), and a plurality of memory cells 10. A plurality of column select switches 20 are connected between sense amplifiers SA, which are each connected to a bit line pair, and input/output line pairs I/O0, I/O0B, I/O1, I/O1B, I/O2, I/O2B, I/O3, and I/O3B, as shown. The input/output line pairs I/O0, I/O0B, I/O1, and I/O1B are arranged on one side of the memory cell array 1 (i.e., the left side in FIG. 1), and the input/output line pairs I/O2, I/O2B, I/O3, and I/O3B are arranged on another side of the memory cell array 1 (i.e., the right side in FIG. 1). The input/output line pairs form input/output buses, which may be shared by adjacent memory cell arrays (not shown). That is, the input/output line pairs I/O0, I/O0B, I/O1, and I/O1B at the left side of the memory cell array 1 form a left input/output bus, and the input/output line pairs I/O2, I/O2B, I/O3, and I/O3B at the right side of the memory cell array 1 form a right input/output bus. The input/output lines comprising the respective data buses transfer 2-bits of data.

Column select lines CSL0 through CSLk are respectively connected to the column select switches 20 for accessing two bit line pairs via the left input bus and two bit line pairs via the right input bus. Therefore, when a column select line is chosen, 2-bits of data may be transferred through the left and right input/output buses, respectively (i.e., 4-bits of data may be input/output). Corresponding drivers 30 are connected to one end of each input/output line pair on the left side of the memory cell array 1. Each driver 30 may supply data to be written to the memory cell array 1 through associated input/output line pairs in response to a signal CA11B. Similarly, corresponding drivers 30 are connected to one end of each input/output line pair on the right side of the memory cell array 1. Each driver 30 may supply data to be written to the memory cell array 1 through associated input/output line pairs in response to a signal CA11.

In a DRAM having the foregoing input/output structure, the memory cell array may be accessed through the right and left input/output buses simultaneously, or, alternatively, through one of the input/output buses through control of the signals CA11 and CA11B. For example, when the signal CA11B is activated and the signal CA11 is deactivated, the drivers 30 connected to the left input/output bus are selected, while the drivers 30 connected to the right input/output bus are unselected. Conversely, when the signals CA11 and CA11B are activated simultaneously, the drivers 30 connected to the left and right input/output buses are selected at the same time.

The DRAM shown in FIG. 1 may be operated in a pull page mode as discussed hereinabove. In the pull page mode, all memory cells connected to a selected word line are sequentially accessed. A write operation of the DRAM in pull page mode may be carried out in multiple ways: In one approach, after data are written to memory cells coupled to a selected word line through an input/output bus at one side of the memory cell array 1, data are then written to memory cells coupled to a selected word line through an input/output bus at the other side of the memory cell array 1. In another approach, data are written simultaneously to all memory cells coupled to a selected word line through the input/output buses at both sides of the memory cell array 1. Unfortunately, when performing a pull page mode write operation according to the first approach described above, a problem may arise as follows.

To carry out a write operation through the left input/output bus, the signal CA11B is activated and the signal CA11 is deactivated. As a result, the drivers 30 connected to the left input/output bus are selected and the drivers 30 connected to the right input/output bus are unselected. The selected drivers 30 supply data to be written to the memory cell array 1 through the left input/output bus, which is connected to selected memory cells through column select switches 20 and sense amplifiers SA associated with a first column select line CSL0. Data are then sequentially written to the remaining memory cells by sequentially activating remaining column select lines in the same manner as described above.

When the signal CA11B is deactivated and the signal CA11 is activated, the drivers 30 connected to the right input/output bus are selected and the drivers 30 connected to the left input/output bus are unselected. The selected drivers 30 supply data to be written to the memory cell array 1 through the right input/output bus. At this time, the left input/output bus connected to the unselected drivers 30 is maintained in a floating state. Data on the right input/output bus is written to selected memory cells through column select switches 20 and sense amplifiers SA associated with the first column select line CSL0. When the first column select line CSL0 is selected to perform a write operation through the right input/output bus, charges on the left input/output bus, which remain after the write operation has been performed through the left input/output bus, are written to the memory cells identified by the dotted line through column select switches 20 and sense amplifiers SA arranged on the left side of the memory cell array 1. This unintended corruption of data stored in the memory cell array 1 may be referred to as a "bit line disturbance phenomenon." As may be seen from FIG. 1, when a column select line is selected, the left input/output bus is connected to corresponding memory cells through associated column select switches 20 and sense amplifiers SA, and the right input/output bus is simultaneously connected to corresponding memory cells through associated column select switches 20 and sense amplifiers SA. As a result, data stored in the memory cell array may be corrupted when performing a write operation through one of the input/output buses following the completion of a write operation on the other one of the input/output buses.

SUMMARY OF THE INVENTION

Embodiments of the present invention include integrated circuit memory devices and methods of writing data thereto in which first and second input/output buses are coupled to a memory cell array. A precharge controller circuit generates a precharge control signal in response to completion of a write operation on the first input/output bus. A precharge circuit drives the first and second input/output buses to a predetermined voltage level in response to the precharge control signal.

Multiple switches may be used to couple the first and second input/output buses to the memory cell array and these switches may also be coupled to a column select line. The switches may be responsive to a column select signal carried on the column select line such that one or more memory cells are coupled to the first input/output bus and one or more memory cells are coupled to the second input/output bus simultaneously. Because both of the input/output buses are coupled to the memory cell array in response to the column select signal, the memory cell array may be susceptible to bit line disturbance in which charges remaining on one input/output bus from a previous write operation corrupt memory cells during a write operation on a second input/output bus. By driving the first and second input/output buses to a predetermined voltage level after completing a write operation on one of the two input/output buses, bit line disturbance may be prevented.

In particular embodiments, the first and second input/output buses are electrically coupled to first and second driver circuits, respectively, which are responsive to a driver control signal. The first and second driver circuits may supply data to be written into the memory cell array through the respective first and second input/output buses. A column select circuit that comprises, for example, a counter, may be used to generate the column select signal and the driver signal.

In further embodiments, the precharge controller circuit comprises a flag signal generator that generates a flag signal in response to completion of a write operation on the first input/output bus, and a precharge signal generator that generates the precharge control signal in response to the flag signal. The precharge circuit may comprise multiple precharge transistors.

Thus, the present invention may provide improved data integrity by preventing bit line disturbance in a memory cell array by driving first and second input/output buses to a predetermined voltage level between respective write operations on the first and second input/output buses.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
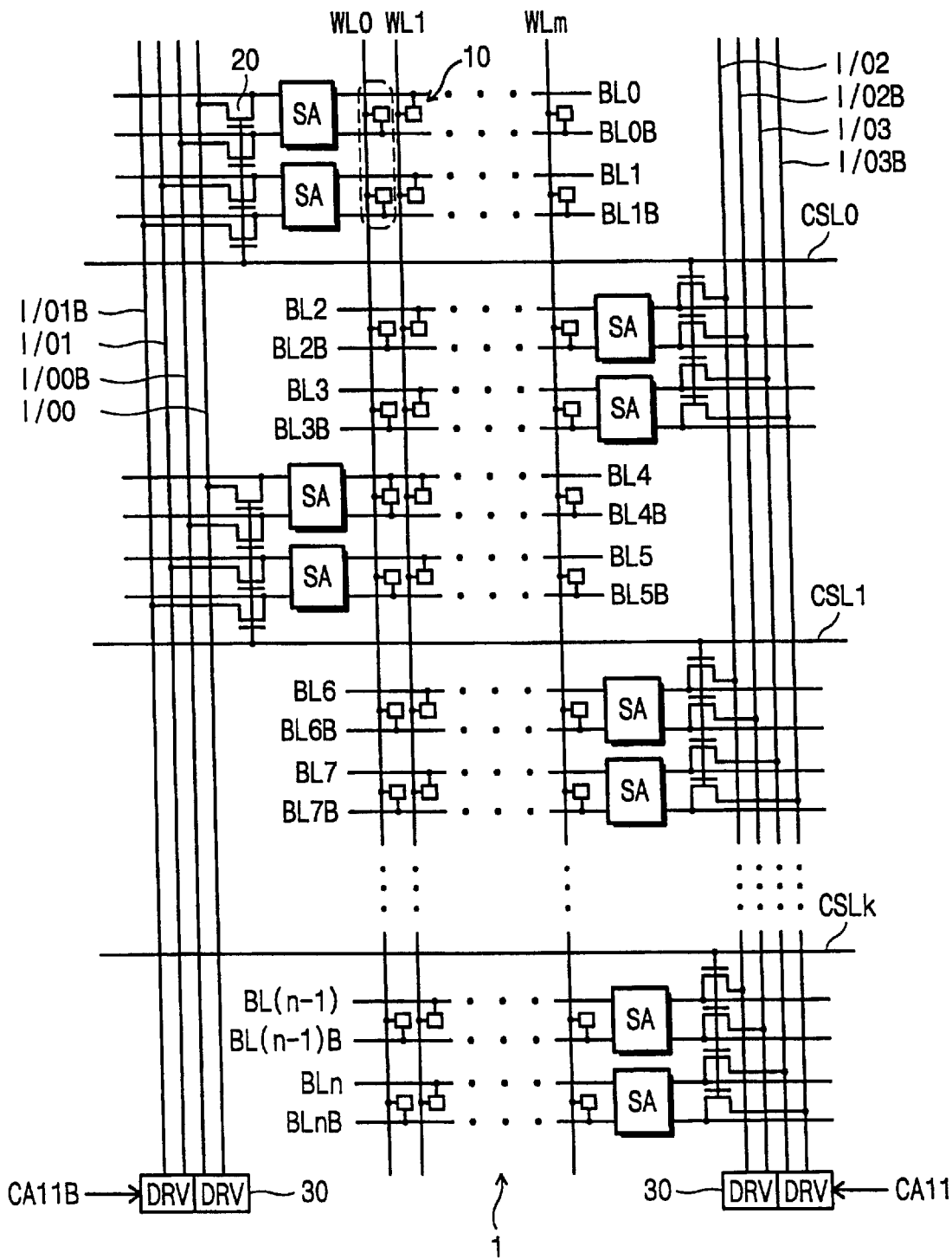
FIG. 1 is a diagram that illustrates a relationship between a memory cell array and pairs of input/output lines in a conventional dynamic random access memory device (DRAM)

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
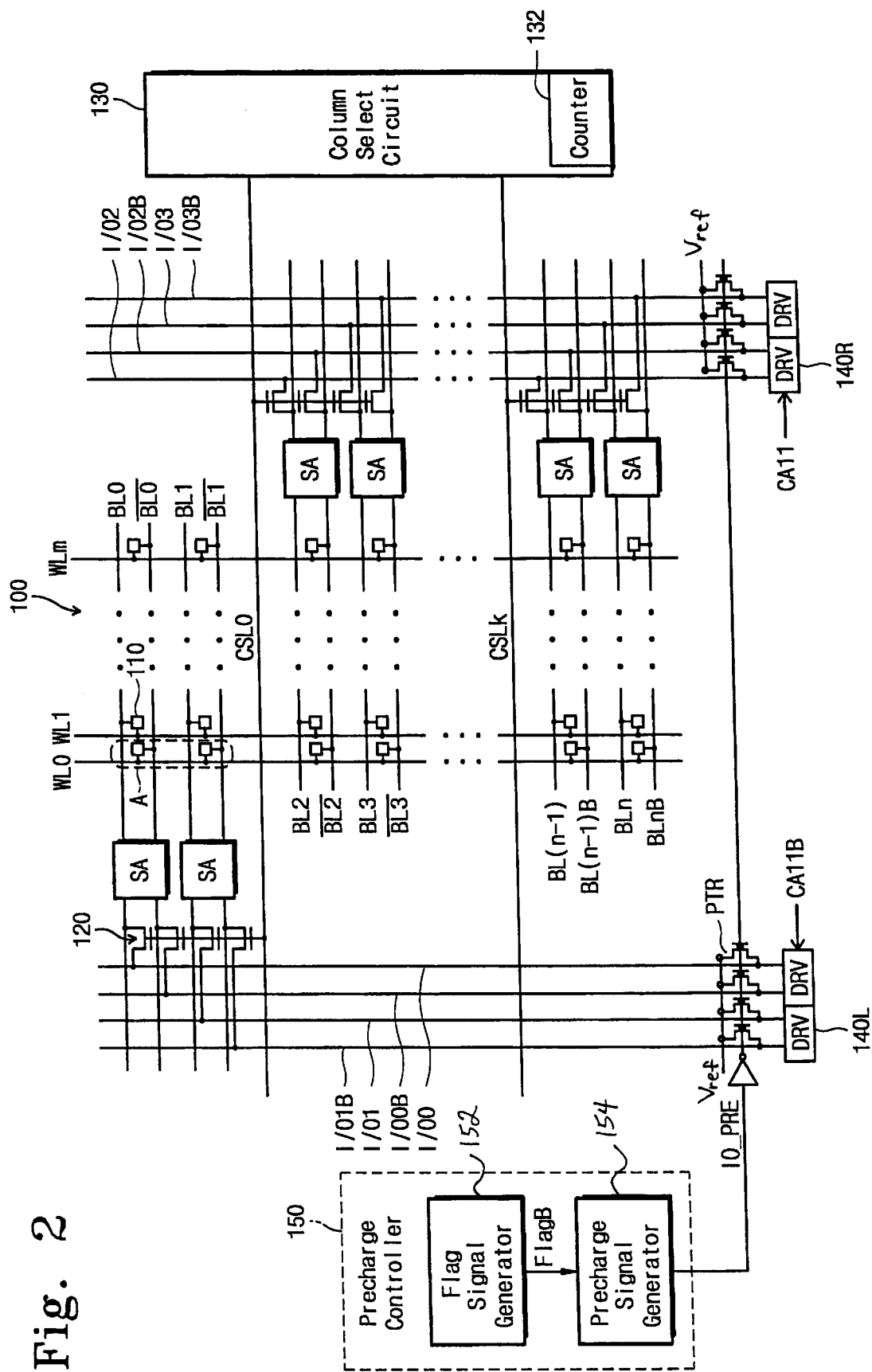
FIG. 2 is a diagram that illustrates integrated circuit memory devices having multiple input/output buses and precharge circuitry in accordance with embodiments of the present invention.

FIG. 2 is a diagram that illustrates synchronous integrated circuit memory devices having multiple input/output buses and precharge circuitry in accordance with embodiments of the present invention. Referring now to FIG. 2, a memory cell array 100 has a plurality of word lines WLi (i=0–m), a plurality of bit line pairs BLj and BLjB (j=0–n), and a plurality of memory cells 110. A plurality of column select switches 20 are connected between sense amplifiers SA, which are each connected to a bit line pair, and input/output line pairs I/O0, I/O0B, I/O1, I/O1B, I/O2, I/O2B, I/O3, and I/O3B, as shown. The input/output line pairs I/O0, I/O0B, I/O1, and I/O1B are arranged on one side of the memory cell array 100 (i.e., the left side in FIG. 1), and the input/output line pairs I/O2, I/O2B, I/O3, and I/O3B are arranged on another side of the memory cell array 100 (i.e., the right side in FIG. 1). The input/output line pairs form input/output buses, which may be shared by adjacent memory cell arrays (not shown). That is, the input/output line pairs I/O0, I/O0B, I/O1, and I/O1B on the left side of the memory cell array 100 form a left input/output bus, and the input/output line pairs I/O2, I/O2B, I/O3, and I/O3B on the right side of the memory cell array 100 form a right input/output bus. The input/output lines comprising the respective the data buses transfer 2-bits of data.

In the FIG. 2 embodiment, each of the input/output buses comprises two pairs of input/output lines. It should be understood, however, that each input/output bus may comprise one, two, or more pairs of input/output lines in accordance with embodiments of the present invention.

The input/output line pairs I/O0, I/O0B, I/O1, and I/O1B on the left side of the memory cell array 100 are connected to drivers 140L. Similarly, the input/output line pairs I/O2, I/O2B, I/O3, and I/O3B on the right side of the memory cell array 100 are connected to drivers 140R. The drivers 140L are selected by a signal CA11B, and the drivers 140R are selected by a signal CA11. That is, the left and right input/output buses are selectively activated by the signals CA11 and CA11B, respectively. The left and right input/output buses may also be simultaneously activated so as to transfer 4-bits of data. This is accomplished by driving the signals CA11 and CA11B to the same logic level. Column select lines CSL0 to CSLk, which are arranged in the same direction as the bit line pairs BLj and BLjB, are connected to a column select circuit 130. The column select circuit 130 sequentially activates the column select lines CSL0 to CSLk in response to an externally applied column address during a pull page mode. The column select circuit includes a counter 132 (e.g., a burst counter) as an internal address generating circuit, which generates a sequence of internal addresses (e.g., burst addresses) in response to an external address. Each of the internal addresses comprises an address (e.g., CA0–CA9), which is used as information for selecting the column select lines CSL0–CSLk, and an address (e.g., CA11), which is used as information for selecting the drivers 140L and 140R.

Figure 3:
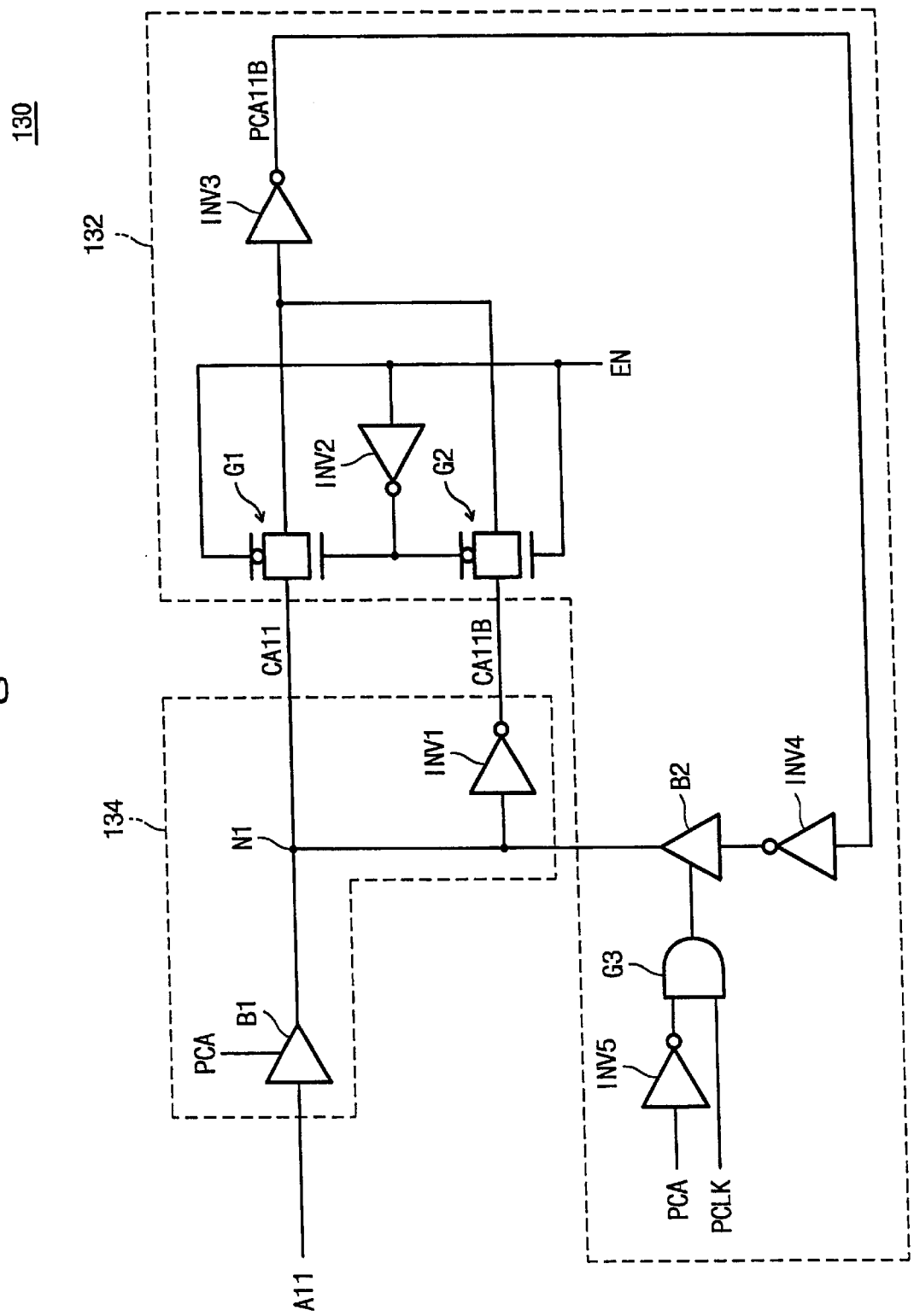
FIG. 3 is a circuit schematic that illustrates a column select circuit in accordance with embodiments of the present invention.

Referring now to FIG. 3, a column select circuit 130, in accordance with embodiments of the present invention, comprises a counter part 132 and an address buffer part 134. The counter part 132 and the address buffer part 134 are responsive to the column address signal CA11 for selecting the drivers 140L and 140R. Counter and address buffer parts responsive to the remaining column address signals may be constructed similarly to those in FIG. 3. The address buffer part 134 includes a buffer B1 that is responsive to an external address bit signal A11 and an inverter INV1 that inverts an output of the buffer B1. The buffer B1 receives the external address bit signal A11 when a signal PCA (e.g., a pulse signal synchronized with a read command) is activated. The counter part 132 is provided with address signals CA11 and CA11B from the address buffer part 134. The counter part 132 has a buffer B2, four inverters INV2–INV5, two transfer gates G1 and G2, and an AND gate G3, which are configured as shown in FIG. 3. The transfer gates G1 and G2 and the inverter INV2 function as a multiplexer, and select one of the output signals CA11 and CA11B from the address buffer part 134 in response to a signal EN. The signal EN is driven to a logic high level when all of the address bit signals (e.g., CA0–CA9) for selecting the column select lines CSL0–CSLk are at logic "1" levels. In this case, the last column select line CSLk is selected.

When the signal PCA is activated at a logic high level, the address buffer part 134 receives the external address A11 through the buffer B1. The buffer B2 is then deactivated by an output signal of the AND gate G3. This electrically isolates the inverter INV4 from a node N1. When one or more of the column address bit signals (e.g., CA0–CA9) are at a logic "0" level (i.e., when the signal EN is at a logic low level), the CA11 output signal from the address buffer part 134 is provided to the counter part 132 through the transfer gate G1. When the signal PCA is deactivated at a logic low level and the signal PCLK is at a logic high level, the signal CA11 provided to the counter part 132 is latched through the inverters INV3 and INV4, the buffer B2, and the transfer gate G1 with relatively little phase change.

When the signal EN transitions from a logic low level to a logic high level in synchronization with a (N–1)th cycle of a clock signal PCLK (i.e., the column address bit signals CA0–CA9 are at logic "1" levels), the transfer gate G1 closes and the transfer gate G2 opens, so that the output signal CA11B of the buffer part 134 is provided to the counter part 132. A signal PCA11B output from the inverter INV3 transitions from a logic high level to a logic low level in the (N–1)th cycle of the clock signal PCLK. Thus, the logic level of the signal PCA11B has an inverted phase. When performing a write operation through the left input/output bus, a last column select line is selected in the (N–1)th cycle. The inverted signal PCA11B is latched through the transfer gate G1, the inverters INV3 and INV4, and the buffer B2 with relatively little phase change when the signal PCA is at a logic low level and the signal PCLK is at a logic high level after an Nth cycle of the clock signal PCLK. This allows a write operation through the right input/output bus to begin in the Nth cycle where the first column select line CSL0 is selected.

Referring again to FIG. 2, the integrated circuit memory device further comprises precharge transistors PTR, which are connected to the input/output lines comprising the left and right input/output buses, respectively. In particular embodiments of the present invention, each of the precharge transistors PTR comprises a PMOS transistor, which is connected to a corresponding input/output line. The gates of the PMOS transistors PTR are connected in common to an output of a precharge controller 150 and are responsive to a precharge signal IO_PRE. The precharge controller 150 generates the precharge signal IO_PRE in the form of a pulse between a first write period, in which data is written to the memory cell array 100 through the left input/output bus, and a second write period, in which data is written to the memory cell array 100 through the right input/output bus. The precharge controller will be described in more detail hereafter.

The precharge controller 150 comprises a flag signal generator 152 and a precharge signal generator 154. The flag signal generator 152 generates a flag signal FlagB that is indicative of whether the internal column address bit signals (e.g., CA0–CA9) for designating column select lines CSL0–CSLk have transitioned to the same logic level (e.g., the logic "1" level). For example, when a write operation is carried out through the left input/output bus, the flag signal generator 152 generates the flag signal FlagB at a logic low level when the column address bit signals for selecting the last column select line CSLk are at logic "1" levels. The precharge signal generator 154 generates the precharge signal IO_PRE in the form of a pulse in response to the flag signal FlagB during the pull page mode write operation. Thus, the precharge transistors PTR are turned on during a period between a write operation through the left input/output bus and a write operation through the right input/output bus to recharge the input/output line pairs I/O0, I/O0B, I/O1, I/OB, I/O2, I/O2B, I/O3 and I/O3B on both sides of the memory cell array 100, based on a reference voltage Vref. The reference voltage Vref may be set at a potential that will charge the left and right input/output buses to a potential that will not corrupt data stored in the memory cell array 100. An exemplary embodiment of the precharge controller 150 is illustrated in FIG. 4 and will be described hereafter.

Figure 4:
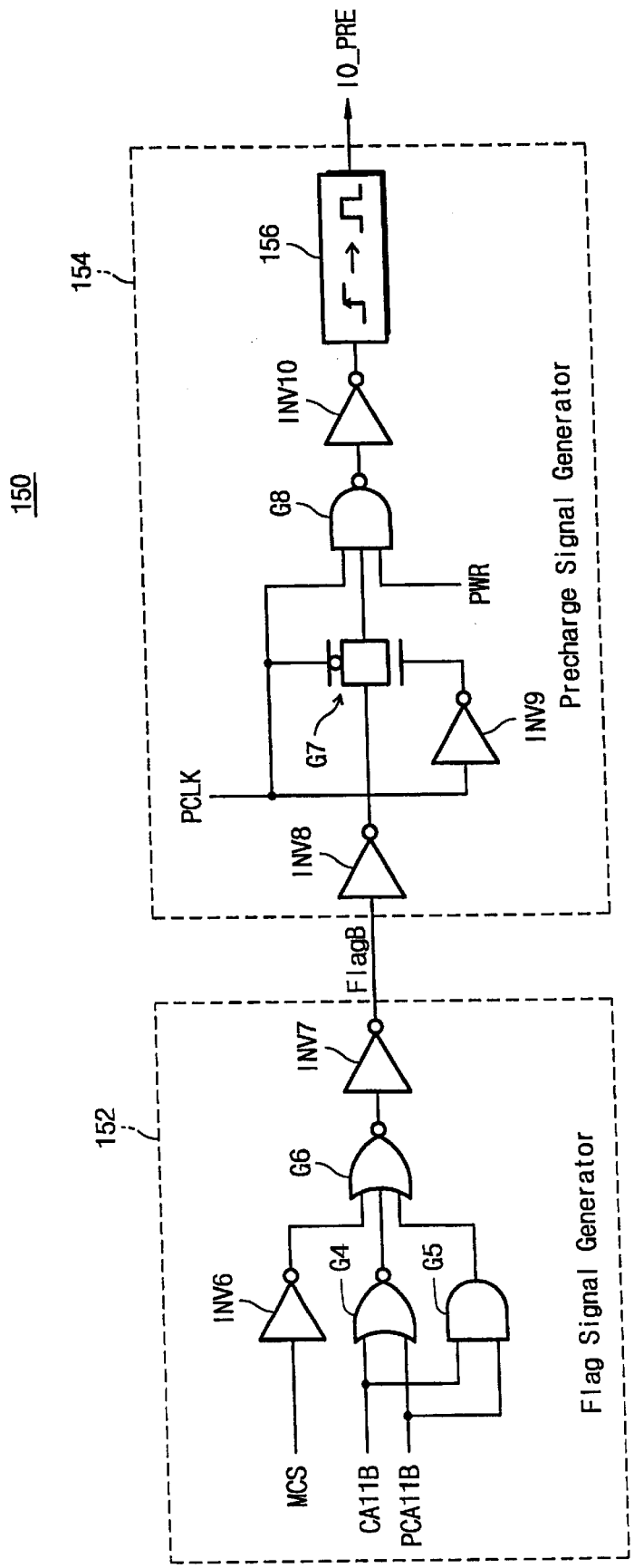
FIG. 4 is a circuit schematic that illustrates a precharge controller in accordance with embodiments of the present invention.

Referring to FIG. 4, the flag signal generator 152, in accordance with embodiments of the present invention, comprises inverters INV6 and INV7, NOR gates G4 and G6, and an AND gate G5, which are configured as shown. A signal MCS is provided as an input signal to the flag signal generator 152 and assumes a logic high level when a pull page mode write operation is first performed through an input/output bus on one side of the memory cell array 100, and then is performed through an input/output bus on the other side of the memory cell array 100. The signal CA11B generated by the address buffer part 134, and the signal PCA11B generated by the counter part 132 (i.e., the output signal of the inverter INV3) are also provided as input signals to the flag signal generator 152. When the signals MCS, CA11B, and PCA11B are maintained at logic high levels (i.e., when a write operation is carried out through the left input/output line pairs), the flag signal FlagB is at a logic high level. When the signal PCA11B transitions from a logic high level to a logic low level (i.e., when internal column address bit signals for selecting column select lines are at logic "1" levels), the flag signal FlagB is driven low during one cycle of the internal clock signal PCLK. In response to a high-to-low transition of the signal CA11B, the flag signal FlagB is driven to a high logic level.

Continuing to refer to FIG. 4, the precharge signal generator 154 comprises inverters INV8, INV9 and INV10, a transfer gate G7, a NAND gate G8, and a pulse generator 156, which are configured as shown. A signal PWR has a logic high level when a write operation is performed. The precharge signal generator 154 receives the flag signal FlagB as an input when the clock signal PCLK is at a logic low level. When an output signal from the inverter INV10 transitions from a logic low level to a logic high level (i.e., when the signal PCLK is at a logic high level and the flag signal FlagB is at a logic low level), the precharge signal generator 154 generates the precharge signal IO_PRE in the form of a pulse through a pulse generator 156.

Figure 5:
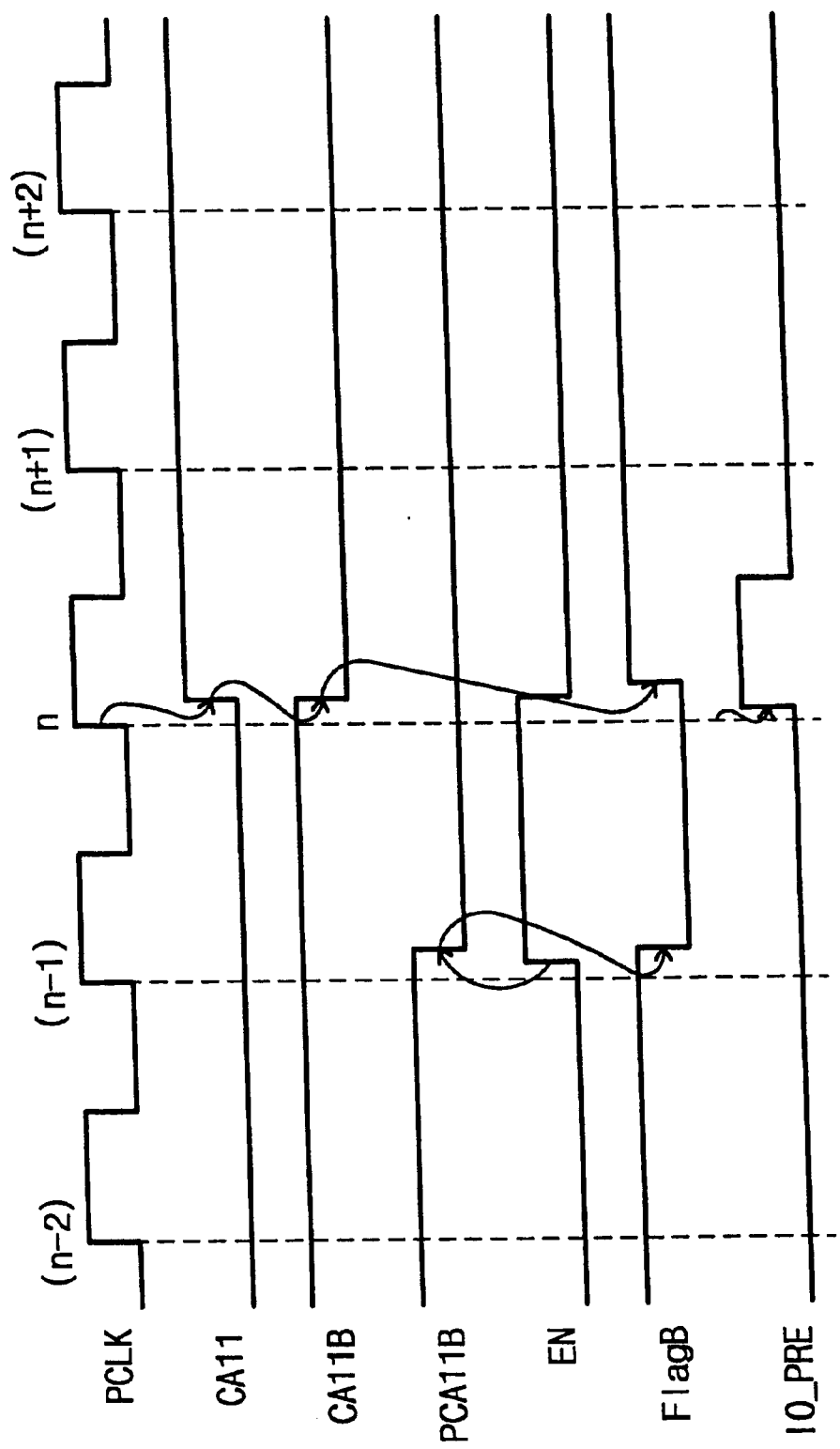
FIG. 5 is a set of signal timing diagrams that illustrate exemplary operations of the integrated circuit memory devices in accordance with embodiments of the present invention.

FIG. 5 is a timing diagram that illustrates pull page mode write operations in accordance with embodiments of the present invention. In particular, an input/output bus precharge operation, in accordance with embodiments of the present invention, will be described in detail hereinafter with reference to the accompanying drawings. A precharge operation may be performed to prevent bit line disturbance after a write operation is performed through the input/output line pairs I/O0, I/OB, I/O1, and I/O1B on the left side of the memory cell array 100, but before a write operation is performed through the input/output line pairs I/O2, I/O2B, I/O3, and I/O3B on the right side of the memory cell array 100.

With reference to FIG. 2, a word line is selected based on an externally applied row address. The column select circuit 130 activates a first column select line CSL0 in response to an externally applied column address (i.e., internal column address bit signals CA0–CA9 are at logic "0" levels). The input/output line pairs I/O0, I/O0B, I/O1, and I/O1B on the left side of the memory cell array 100 are connected to corresponding bit line pairs BL0, BL0B, BL1, and BL1B through corresponding column select switches 120 and sense amplifiers SA in response to the activation of the column select line CSL0. Similarly, the input/output line pairs I/O2, I/O2B, I/O2, and I/O2B on the right side of the memory cell array 100 are connected to corresponding bit line pairs BL2, BL2B, BL3, and BL3B through corresponding column select switches 120 and sense amplifiers SA in response to the activation of the column select line CSL0.

As illustrated in FIG. 5, when the column address bit signal CA11 is at a logic low level, the drivers 140L connected to the left input/output bus are selected and the drivers 140R connected to the right input/output bus are unselected. Data to be written to the memory cell array 100 may then be transferred to the left input/output bus through the selected drivers 140L. Specifically, transferred data bits may be written into memory cells that are located at a region marked with a dotted line A in FIG. 2. Because at least one of the internal column address bit signals CA0–CA9 is at a logic "0" level, the signal EN is maintained at a logic low level. Therefore, referring to FIG. 3, the signal PCA11B is latched at a logic high level through the transfer gate G1, the inverters INV3 and INV4, and the buffer B1.

The counter 132 of the column select circuit 130 generates a sequence of internal column addresses in response to the external column address so that the remaining column select lines CSL1 to CSLk are sequentially selected. When all of the bit signals of the external column address are at the logic "1" level in synchronization with the (N−1)th cycle of the clock signal PCLK (i.e., when the last column select line CSLk is selected), the signal EN transitions from a logic low level to a logic high level. In addition, the flag signal FlagB transitions from a logic high level to logic low level. The high-to-low transition of the flag signal FlagB is transferred to one input terminal of the NAND gate G8 (see FIG. 4) through the transfer gate G7 when the clock signal PCLK in the (N−1)th cycle is at a logic low level. When the clock signal PCLK transitions to a logic high level in the Nth cycle, the precharge signal IO_PRE is generated in the form of a pulse so that the precharge transistors PTR are turned on. As a result, all of the input/output lines on both the left and right sides of the memory cell array 100 (i.e., the left and right input/output buses) are precharged.

As illustrated in FIG. 5, the signals CA11 and CA11B transition to a logic high level and a logic low level, respectively, when the clock signal PCLK in the Nth cycle transitions to a logic high level. In response to the transitions of the signals CA11 and CA11B, the drivers 140L on the left side of the memory cell array 100 are unselected and the drivers 140R on the right side of the memory cell array are selected. At the same time, the internal column address bit signals (i.e., CA0–CA9), which are used to select the column select lines, take on logic "0" values so that the first column select line CSL0 is selected next.

Therefore, the input/output line pairs I/O0, I/O0B, I/O1, and I/O1B on the left side of the memory cell array 100 are connected to corresponding bit line pairs BL0, BL0B, BL1, and BL1B through corresponding column select switches 120 and sense amplifiers SA, in response to the selection of the column select line CSL0. Similarly, the input/output line pairs I/O2, I/O2B, I/O3, and I/O3B on the right side of the memory cell array 100 are connected to corresponding bit line pairs BL2, BL2B, BL3, and BL3B through corresponding column select switches 120 and sense amplifiers SA, in response to the selection of the column select line CSL0. Advantageously, the bit line disturbance phenomenon may be avoided because all of the input/output line pairs I/O0–I/O3B on the left and right sides of the memory cell array 100 have been precharged between a period in which data is written to the memory cell array 100 through the left input/output bus, and a period in which data is written to the memory cell array 100 through the right input/output bus. A write operation may then be performed through the right input/output bus in the same manner as discussed above with respect to the left input/output bus.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit memory device, comprising:
   a memory cell array;
   first and second input/output buses that are coupled to the memory cell array; and
   a precharge controller unit that drives the first and second input/output buses to a predetermined voltage level in response to completion of a write operation on the first input/output bus.

2. The integrated circuit memory device as recited in claim 1, wherein the precharge unit comprises:
   a precharge controller circuit that generates a precharge control signal in response to completion of the write operation on the first input/output bus; and
   a precharge circuit that drives the first and second input/output buses to the predetermined voltage level in response to the precharge control signal.

3. The integrated circuit memory device as recited in claim 2, wherein the memory cell array comprises a plurality of memory cells, the integrated circuit memory device further comprising:
   a plurality of switches that are operable to selectively couple the first and second input/output buses to the memory cell array; and
   a column select line that is electrically coupled to the plurality of switches, the plurality of switches being configured to simultaneously couple at least a first one of the plurality of memory cells to the first input/output bus and at least a second one of the plurality of memory cells to the second input/output bus in response to a column select signal carried on the column select line.

4. The integrated circuit memory device as recited in claim 3, further comprising:
   a column select circuit that generates the respective column select signals and a driver control signal in response to an external address.

5. The integrated circuit memory device as recited in claim 4, wherein the column select circuit comprises a counter.

6. The integrated circuit memory device as recited in claim 4, further comprising:
   a first driver circuit that is electrically coupled to the first input/output bus and is responsive to the driver control signal; and
   a second driver circuit that is electrically coupled to the second input/output bus and is responsive to the driver control signal.

7. The integrated circuit memory device as recited in claim 2, wherein the precharge controller circuit comprises:
   a flag signal generator that generates a flag signal in response to completion of the write operation on the first input/output bus;
   a precharge signal generator that generates the precharge control signal in response to the flag signal.

8. The integrated circuit memory device as recited in claim 2, wherein the precharge circuit comprises a plurality of precharge transistors.

9. A method of writing data to an integrated circuit memory device, comprising the steps of:
   providing a memory cell array that comprises a plurality of memory cells;
   writing data to the memory cell array over a first input/output bus;
   writing data to the memory cell array over a second input/output bus; and
   driving the first and second input/output buses to a predetermined voltage level between the steps of writing data to the memory cell array over the first input/output bus and writing data to the memory cell array over the second input/output bus.

10. The method as recited in claim 9, further comprising the step of:
    generating a precharge control signal between the steps of writing data to the memory cell array over the first input/output bus and writing data to the memory cell array over the second input/output bus.

11. The method as recited in claim 10, wherein the step of driving the first and second input/output buses to the predetermined voltage level comprises the step of:
    driving the first and second input/output buses to the predetermined voltage level in response to the precharge control signal.

12. The method as recited in claim 10, wherein the step of generating the precharge control signal comprises the steps of:
    generating a flag signal after the step of writing data to the memory cell array over the first input/output bus; and
    generating the precharge control signal in response to the flag signal.

13. The method as recited in claim 9, further comprising the steps of:
    generating a plurality of column select signals; and
    simultaneously coupling at least a first one of the plurality of memory cells to the first input/output bus and at least a second one of the plurality of memory cells to the second input/output bus in response to at least one of the plurality of column select signals.

14. An integrated circuit memory device, comprising:
    a memory cell array that comprises a plurality of memory cells;
    means for writing data to the memory cell array over a first input/output bus;
    means for driving the first and second input/output buses to a predetermined level, responsive to the means for writing data to the memory cell array over the first input/output bus; and
    means for writing data to the memory cell array over a second input/output bus, responsive to the means for driving.

15. The integrated circuit memory device as recited in claim 14, further comprising:
    means for generating a precharge control signal, responsive to the means for writing data to the memory cell array over the first input/output bus.

16. The integrated circuit memory device as recited in claim 15, wherein the means for driving is responsive to the precharge control signal.

17. The integrated circuit memory device as recited in claim 15, wherein the means for generating the precharge control signal comprises:
    means for generating a flag signal, responsive to the means for writing data to the memory cell array over the first input/output bus; and
    means for generating the precharge control signal, responsive to the flag signal.

18. The integrated circuit memory device as recited in claim 14, further comprising:
    means for generating a plurality of column select signals; and means for simultaneously coupling at least a first one of the plurality of memory cells to the first input/output bus and at least a second one of the plurality of memory cells to the second input/output bus, responsive to at least one of the plurality of column select signals.

19. A semiconductor memory device comprising:

a memory cell array including a plurality of memory cells, a plurality of word lines and a plurality of bit line pairs;

first and second input/output buses arranged at both sides of the memory cell array, respectively;

a plurality of column selection lines each for simultaneously selecting the first and second input/output buses;

a precharge circuit for charging the first and second input/output buses at a predetermined voltage in response to a precharge signal during a full-page mode; and a precharge controller for generating the precharge signal during the full-page mode, wherein the precharge controller generates the precharge signal of a pulse form between a first period, in which data is written to the array via the first input/output bus at an (n−1)th cycle of a clock signal, and a second period, in which data is written to the array via the second input/output bus at an n-th cycle of the clock signal.

20. A synchronous semiconductor memory device having a full-page mode in which all memory cells in a row are accessed, comprising:

a memory cell array of memory cells arranged in plural rows and plural columns;

a first plurality of input/output line pairs arranged at a first side of the memory cell array;

a second plurality of input/output line pairs arranged at a second side of the memory cell array;

a plurality of column selection lines each for simultaneously activating the input/output line pairs of the first and second pluralities;

a plurality of precharge transistors coupled to the input/output line pairs of the first and second pluralities, for charging the input/output line pairs of the first and second pluralities at a predetermined voltage in response to a precharge signal during the full-page mode;

a precharge controller for generating the precharge signal of a pulse form during the full-page mode; and driving means including a first driving circuit, which supplies the input/output line pairs of the first plurality with data to be written to the memory cell array, and a second driving circuit, which supplies the input/output line pairs of the second plurality with data to be written to the memory cell array;

wherein the precharge controller generates the precharge signal of the pulse form after data is written to the array via the first input/output line pairs of the first plurality at an (n−1)th cycle of a clock signal and before data is written to the array via the second input/output line pairs of the second plurality at an n-th cycle of the clock signal.

21. A method of writing data to a synchronous semiconductor memory device which has a memory cell array of memory cells arranged in plural rows and plural columns, a first plurality of input/output line pairs arranged at one side of the memory cell array, and a second plurality of input/output line pairs arranged at the other side of the memory cell array, the method comprising the steps of:

writing data to the memory cell array via the first plurality of input/output line pairs;

checking whether internal column address bit signals all transition to logic "1"

precharging the first and second pluralities of input/output line pairs at a predetermined voltage when the internal column address bit signals all transition to logic "1"; and writing data to the memory cell array via the second plurality of input/output line pairs.

22. An integrated circuit memory device comprising:

a memory cell array comprising a plurality of memory cells, a plurality of word lines and a plurality of bit line pairs;

first and second input/output buses arranged at both sides of the memory cell array, respectively;

a plurality of column selection lines that are configured to select the first and second input/output buses;

a precharge circuit that is configured to charge the first and second input/output buses at a predetermined voltage in response to a precharge signal during a full-page mode; and a precharge controller that is configured to generate the precharge signal during the full-page mode between a first time interval in which data is written to the array via the first input/output bus and a second time interval in which data is written to the array via the second input/output bus.

* * * * *